US006919682B2

(12) United States Patent
Cheong et al.

(10) Patent No.: US 6,919,682 B2
(45) Date of Patent: Jul. 19, 2005

(54) MAGNESIUM BARIUM THIOALUMINATE AND RELATED PHOSPHOR MATERIALS

(75) Inventors: Dan Daeweon Cheong, Mississauga (CA); Xingwei Wu, Brampton (CA)

(73) Assignee: iFire Technology Inc., Alberta (CA)

( * ) Notice: Subject to any disclaimer, the term of this patent is extended or adjusted under 35 U.S.C. 154(b) by 148 days.

(21) Appl. No.: 10/441,872

(22) Filed: May 20, 2003

(65) Prior Publication Data

US 2004/0027048 A1 Feb. 12, 2004

Related U.S. Application Data

(62) Division of application No. 09/798,203, filed on Mar. 2, 2001, now abandoned.
(60) Provisional application No. 60/232,549, filed on Sep. 14, 2000.

(51) Int. Cl.[7] .............................. H01J 1/62; H01J 63/04
(52) U.S. Cl. ...................... 313/502; 313/504; 313/503; 428/690; 252/301.4 R
(58) Field of Search ................................. 313/504, 485, 313/486, 503; 428/690; 252/301.4 R (56) References Cited

U.S. PATENT DOCUMENTS

| | | | | |
|---|---|---|---|---|
| 3,742,277 | A | * | 6/1973 | Peters ......................... 313/467 |
| 5,309,070 | A | | 5/1994 | Sun et al. .................... 313/503 |
| 5,432,015 | A | | 7/1995 | Wu et al. .................... 428/690 |
| 5,505,986 | A | | 4/1996 | Velthaus et al. .............. 427/61 |
| 5,581,150 | A | | 12/1996 | Rack et al. .................. 313/509 |
| 5,598,059 | A | | 1/1997 | Sun et al. .................... 313/509 |
| 5,656,888 | A | | 8/1997 | Sun et al. .................... 313/503 |
| 5,714,274 | A | | 2/1998 | Sugiura et al. .............. 428/690 |
| 5,834,053 | A | * | 11/1998 | Dye et al. ..................... 427/66 |
| 6,686,062 | B2 | * | 2/2004 | Cheong et al. .............. 428/690 |

FOREIGN PATENT DOCUMENTS

| | | | | |
|---|---|---|---|---|
| EP | 12635 | A | * | 6/1980 ............ C01G/0/00 |
| EP | 0667383 | A | | 8/1995 |
| EP | 0 740 490 | | | 10/1996 |
| JP | 07122364 | | | 5/1995 |
| JP | 8-134440 | | | 5/1996 |

OTHER PUBLICATIONS

M. Kawanishi, et al. "Blue Emitting $BaAl_2S_4$:Eu TFEL Devices Prepared by Two Targets Pulse Electron Beam Evaporation", International Display Workshop 1999.

P. Benalloul, et al. "$IIAIII_2$–$S_4$ ternary compounds: New host matrices for full color thin film electroluminescence displays", Appl. Phys. Lett 63(14), p. 1954–1956.

(Continued)

Primary Examiner—Ashok Patel
Assistant Examiner—Kevin Quarterman
(74) Attorney, Agent, or Firm—Frommer, Lawrence & Haug LLP; Matthew K. Ryan (57) ABSTRACT

A phosphor and a method of deposition. The phosphor comprises a composition of the formula $M'_aBa_{1-a}M''_2M'''_4$; RE, where M' is at least one element selected from magnesium and calcium, M'' is at least one element selected from aluminum, gallium and indium, M''' is at least one element selected from sulphur, selenium and tellurium, RE is at least one rare earth element, especially europium or cerium, and $0<a<1$. Deposition is preferably by dual source electron beam deposition. The phosphor may be annealed. The phosphor provides a high luminosity blue emission that does not require an optical filter to achieve acceptable color coordinates for the blue sub-pixel element for a full color thin film or thick film electroluminescent display. The blue sub-pixel pixel performance meets the luminosity and color temperature specifications for current generation cathode ray tube displays.

20 Claims, 8 Drawing Sheets

OTHER PUBLICATIONS

P.D. Rack, et al. "P–27: Brighter Blue $Ca_2Sr_{1-x}Ga_2S_3$:Ce EL Devices with an Electron Injection Layer", S/D 95 Digest, p. 480–483.

P.C. Donohue, et al. "The Synthesis and Photoluminescence of $M^{II} M_2^{III}(S,Se)_4$", J. Electrochem. Soc., Jan. 1974, p. 137–141.

K.T. Le Thi, et al. "Investigation of the $MS–Al_2S_3$ systems (M=Ca, Sr, Ba) and luminescence properties of europium–doped thioaluminates", Material Science and Eningeering B14 (1992) 393–397.

* cited by examiner

MAGNESIUM BARIUM THIOALUMINATE AND RELATED PHOSPHOR MATERIALS

RELATED APPLICATIONS

This appications is a divisional application of U.S. application Ser. No. 09/798,203, filed Mar. 2, 2001 now abandoned which claims the benifit of Provisional Application 60/232,549, filed Sep. 14, 2000.

FIELD OF THE INVENTION

The present invention relates to a high luminosity blue phosphor. In particular, the present invention relates to a blue phosphor that may be used without an optical filter to provide acceptable colour coordinates for the blue sub-pixel element of a full-colour electroluminescent display. In preferred embodiments, the electroluminescent displays employ thick film dielectric layers with a high dielectric constant. In embodiments, the phosphor is $M'_a Ba_{1-a} M''_2 M'''_4 RE$, where M' is selected from magnesium and calcium, M" is selected from aluminum, gallium and indium, M'" is selected from sulphur, selenium and tellurium, and RE is a rare earth element, especially europium and cerium.

BACKGROUND TO THE INVENTION

Thin film electroluminescent (TFEL) displays are known and are typically fabricated on glass substrates. Electroluminescent displays with thin film phosphors employing thick film dielectric layers fabricated on ceramic substrates, as exemplified by U.S. Pat. No. 5,432,015 provide greater luminance and superior reliability.

A high luminosity full colour electroluminescent display requires the use of red, green and blue sub-pixels. Optical filters are needed to achieve the required colour coordinates for each sub-pixel. Consequently, the thin film phosphor materials used for each sub-pixel must be patterned so that there is minimal attenuation of the emission spectrum for each colour of pixel by the optical filters. For relatively low-resolution displays, the required patterning can be achieved by depositing the phosphor materials through a shadow mask. For displays with high resolution, however, the shadow mask technique does not provide adequate accuracy, and photolithographic methods must be employed. Photolithographic techniques require the deposition of photoresist films and the etching or lift-off of portions of the phosphor film to provide the required pattern.

Deposition and removal of photoresist films and etching or lift-off of phosphor films typically require the use of solvent solutions that contain water or other protic solvents. Some phosphor materials, for example strontium sulphide are susceptible to hydrolysis, and water and aprotic solvents may degrade the properties of the phosphor materials.

The deficiencies in phosphor materials are most severe with the phosphors used for blue sub-pixels, and may be compensated for to some extent by increasing the area of the blue sub-pixels relative to the area of the red and green sub-pixels. However, such a design modification demands increased performance from the phosphor materials used for the red and green phosphor materials, and requires the use of higher display operating voltages. The higher operating voltages increase the power consumption of the display, decrease the reliability and increase the cost of operating the electronics of the display.

Thick film dielectric structures provide superior resistance to dielectric breakdown, as well as a reduced operating voltage. When deposited on a ceramic substrate, the thick film dielectric structure will withstand higher processing temperatures than TFEL devices on glass substrates. The increased tolerance to higher temperatures facilitates annealing of the phosphor films at higher temperatures, to improve luminosity. However, even with the enhanced luminosity that is obtained, thick film electroluminescent displays have not achieved the phosphor luminance and colour coordinates needed to be fully competitive with cathode ray tube (CRT) displays. Moreover, recent trends in CRT specifications are to higher luminance and higher colour temperature.

Traditionally, cerium-activated strontium sulphide has been the phosphor material of choice for blue electroluminescence. This material has a relatively high efficiency of conversion of electrical to optical energy, of up to about 1 lumen per watt of input power. However, the emission spectrum of cerium-activated strontium sulphide contains a substantial green emission in addition to the required blue emission, producing a cyan colour. This necessitates the use of an optical filter to achieve acceptable blue colour coordinates. The filter substantially attenuates the luminosity of the phosphor, and it is therefore difficult to achieve adequate display luminosity. It is known that the spectral emission of cerium-activated strontium sulphide phosphor may be shifted to some degree towards blue by controlling deposition conditions and activator concentration, but not to an extent required to eliminate the need for an optical filter.

Alternate blue phosphor materials have been evaluated. These include cerium-activated alkaline earth thiogallate compounds, which give good blue colour coordinates, but have relatively poor luminosity and stability. Lead-activated calcium sulphide has also been shown to provide excellent blue colour coordinates when the lead activator is introduced as a dimer, but this material is subject to degradation of the dimer species into isolated activator atoms that provide an ultraviolet rather than blue emission. Europium-activated barium thioaluminate provides excellent blue colour coordinates and higher luminance, but must be annealed at high temperature to achieve this performance.

Improvements in the luminance and emission spectrum of phosphor materials used for blue sub-pixels in full colour AC electroluminescent displays employing thick film dielectric layers with a high dielectric constant would be useful. The thick film dielectric structure would provide superior resistance to dielectric breakdown as well as a reduced operating voltage, compared to thin film electroluminescent (TFEL) displays.

SUMMARY OF THE INVENTION

New phosphor materials for blue sub-pixels have now been found. Such phosphors may be used without optical filters.

Accordingly, one aspect of the present invention provides a phosphor comprising a composition of the formula $$M'_a Ba_{1-a} M''_2 M'''_4 : RE,$$

where

M' is at least one element selected from the group consisting of magnesium and calcium, M" is at least one element selected from the group consisting of aluminum, gallium and indium, M'" is at least one element selected from the group consisting of sulphur, selenium and tellurium, RE is at least one rare earth element, and $0 < a < 1$.

In preferred embodiments of the invention, the phosphor has been annealed.

In further embodiments, M" is aluminum, especially with RE being europium and/or M'" being sulphur. Preferably, M' is magnesium, M'" is sulphur and RE is europium.

In additional embodiments, "a" is in the range of 0.4 to 0.8, especially with the phosphor comprising a eutectic composition, or in the range of 0.7 to 0.8.

A further aspect of the present invention provides a method for the preparation of a phosphor on a substrate, said phosphor comprising a composition of the formula $M'_aBa_{1-a}M''_2M'''_4{:}RE$, where M' is at least one element selected from the group consisting of magnesium and calcium, M" is at least one element selected from the group consisting of aluminum, gallium and indium, M'" is at least one element selected from the group consisting of sulphur, selenium and tellurium, RE is at least one rare earth element, and $0<a<1$, said method comprising using a compound of the formula $M''_2M'''_3$ as a first source in a dual source electron beam evaporation apparatus and using a mixture of compounds of the formulae M'M'" and BaM'" as a second source in said apparatus, said compound of the first source and said compounds of the second source being in the ratios to provide a composition of the phosphor and at least one of the first and second sources including a compound of the formula REM'", and effecting electron beam evaporation from said first and second sources to a substrate to be coated with said phosphor.

In preferred embodiments, the phosphor so obtained is annealed.

In further embodiments, the method provides phosphors as defined above.

In other embodiments, the phosphor is annealed at a temperature of at least about 850° C., or the phosphor is annealed at a temperature of at least about 600° C.

In further embodiments, RE is europium in an amount of not more than 3 atomic percent, base on the amount of M' and barium, most preferably in which REM'" is europium sulphide. Europium sulphide may be replaced in whole or in part with europium oxide.

BRIEF DESCRIPTION OF THE DRAWINGS

The present invention is illustrated by the embodiments shown in the drawings, in which.

DETAILED DESCRIPTION OF THE INVENTION

The present invention relates to improving the luminance and emission spectrum of phosphor materials used for blue sub-pixels. It is believed that the phosphors of the present invention will have a wide range of uses. The phosphors of the invention are particular described herein with respect to use in thick film electroluminescent displays, but it is believed that the phosphors may also be used in conjunction with thin film electroluminescent displays and in other end-uses.

A preferred embodiment of the invention is to use the phosphors in full colour AC electroluminescent displays employing thick film dielectric layers with a high dielectric constant. The preferred thick film dielectric structures provide superior resistance to dielectric breakdown as well as a reduced operating voltage compared to thin film electroluminescent (TFEL) displays.

One aspect of the invention is directed to improving the performance of a barium thioaluminate phosphor, at a lower annealing temperature. In some binary compounds formed from two distinct elements or pseudo-binary compounds, formed from two distinct compounds, a composition may be formed with a finite concentration of two constituent elements or compounds and with a minimum melting temperature. In metallurgy, such a composition is termed the eutectic composition, but the phenomenon also occurs where, the constituent elements or compounds are ceramics rather than metals. For instance, in the formulation of a manganese-activated zinc germano-silicate, a pseudo-binary electroluminescent phosphor may be formed from zinc silicate and zinc germanate. The phosphor obtained has a lower annealing temperature than either of its pseudo-binary components.

The pseudo-binary phosphor material requires acceptable electron transport properties. The matrix or host material acts as a medium in which electrons can be accelerated with minimal probability of scattering from impurities, lattice defects or grain boundaries. This maximizes the probability that energy transfer from the accelerated electrons is via impact excitation of the activator species. Light is emitted as the activator atoms return back to their ground or unexcited state. While not bound by any theory, the inventors believe that electron transport would be optimized in a pseudo-binary phosphor material by substituting atoms at lattice sites of one component compound with atoms of the other component having the same valence state. In this manner, electron scattering due to the substitutions of atoms in the crystal lattice would be minimized and the dominant mechanism for energy transfer from the accelerated electrons would be by impact excitation of activator atoms resulting in light emission.

In barium thioaluminate, the above conditions for substitution could be met if barium is substituted with another element from Group II in the Periodic Table of Elements, for example magnesium or calcium. The conditions may also be met by substituting aluminum with another element in Group III of the Periodic Table, for example gallium or indium; or if sulphur were substituted with another element in Group VI of the Periodic Table, for example selenium or tellurium. The substitutions must occur in a manner that avoids causing a substantial change in the crystal structure of the phosphor material, or causing a second phase to precipitate within the phosphor material as a result of the substitutions. In addition, the activator of the phosphor must be soluble in the host lattice, and consequently the lattice constant of the pseudo-binary host material would need to be such that there is adequate dissolution of the activator species.

Another aspect of the present invention provides a phosphor formed from a composition of the formula $M'_aBa_{1-a}M''_2M'''_4{:}RE$, where M' is at least one of magnesium and calcium, M" is at least one of aluminum, gallium and indium, M'" is at least one of sulphur, selenium and tellurium, RE is a rare earth element, especially europium and cerium, and $0<a<1$.

In preferred embodiments of the invention, each of M', M" and M'" is a single element. In particular, M' is magnesium, M" is aluminum and M'" is sulphur. The preferred rare earth element (RE) is europium.

In embodiments of the invention, the value of "a" is in the range of 0.1 to 0.9, preferably in the range of 0.4 to 0.8. In particularly preferred embodiments of the invention, the value of "a" is selected so that the composition forms a pseudo-binary composition, with a melting point that is lower than the melting point of corresponding barium thioaluminate. In further preferred embodiments, the value of "a" is in the range of 0.5–0.75 or in the range of 0.7–0.8. As exemplified hereinafter, values of "a" in the range of 0.4–0.8 are believed to result in the formation of a eutectic composition and values of "a" in the range of 0.7–0.8 are believed to result in the formation of a single phase composition.

In a particular embodiment, the phosphor is formed from a composition of a magnesium barium thioaluminate.

The elemental composition of the phosphor and its activator may be selected to provide a blue emission spectrum with colour coordinates acceptable for blue sub-pixels, without the need for an optical filter.

The phosphor may be in the form of a thin film electroluminescent phosphor.

It is anticipated that europium activated magnesium barium thioaluminate will be less susceptible to hydrolysis than cerium activated strontium sulphide, thus rendering it easier to pattern using photolithographic techniques.

The preferred method of deposition of the phosphor on the substrate is by the use of dual source electron beam deposition. In such a method, a compound of the formula $M''_2M'''_3$, where M" and M'" are defined above, is used as the first source in the dual source electron beam evaporation apparatus. The compound is conveniently in the form of a pellet. A mixture of compounds of the formulae M'M'" and BaM'", where M', M" and M'" are as defined above, is used as the second source in the apparatus. The mixture of compounds is also conveniently in the form of a pellet. The various compounds of the first and second sources are in the ratios required to provide the required composition of the phosphor. It is understood that the ratios in the pellets might differ slightly from those of the composition of the phosphor, to allow for different rates of evaporation of the various compounds during the deposition process, and it is understood that ratios of compositions in pellets may need to be adjusted so as to obtain the desired composition in the deposited film. It is understood that in a dual source electron beam deposition process, the compounds of the phosphor are used per se and there are no by-products of the process. The compounds are evaporated from the respective sources and deposited onto the substrate that is to be coated.

If the rare earth metal is europium, the compound REM'" used in the method to form the phosphor is most preferably europium sulphide. In embodiments, the amount of europium is up to 3 atomic percent based on the combined amount of M', especially magnesium, and barium. In embodiments in which the amount of europium is up to 3 atomic percent, the europium sulphide may be placed in whole or in part with europium oxide, especially $Eu_2O_3$.

In preferred embodiments of the invention, the phosphor is subjected to an annealing step. The annealing step is carried out after the phosphor has been deposited on the substrate on which it is to be used. The annealing step must be at a temperature that is sufficiently low to prevent melting or degradation of the substrate. However, the temperature should also be above the temperature at which annealing will occur and preferably above the temperature at which the deposited compounds will form a film having a homogeneous composition. With ceramic materials used in electroluminescent displays with thick film dielectrics, the temperature is at least about 850° C., and at such temperature the period of the annealing should be short e.g. 1–2 minutes. Longer periods of time may be used at lower temperatures e.g. at temperatures of 600–650° C., the time may be increased to for example 10 minutes or longer. Such times will depend on the particular substrate being used.

The preferred substrate is a thick film ceramic material, which are known in the art. In embodiments, the substrate comprises a ceramic sheet, typically alumina, upon which an electrically conductive film, typically gold or a silver alloy, is deposited. A thick film layer consisting of a ferroelectric material and typically comprising one or more of lead magnesium niobate titanate, lead zirconate titanate or barium titanate is deposited on the electrically conductive film. The phosphor film is deposited on the thick film layer followed by an optically transparent but electrically conductive film to form the second electrode for the resultant sub-pixel.

Thin film dielectric layers may be deposited on the thick film layer to mediate undesirable chemical and physical interactions between the deposited phosphor film and the thick and other underlying layers. Thin film dielectric layers may also be deposited on top of the phosphor film prior to deposition of the optically transparent and electrically conductive film. Such further thin film dielectric layers may be comprised of alumina silicon oxynitride, yttria, hafnia zinc sulphide, barium tantalate, barium titanate, tantalum oxide, aluminum titanate, strontium titanate and the like.

Figure 1:
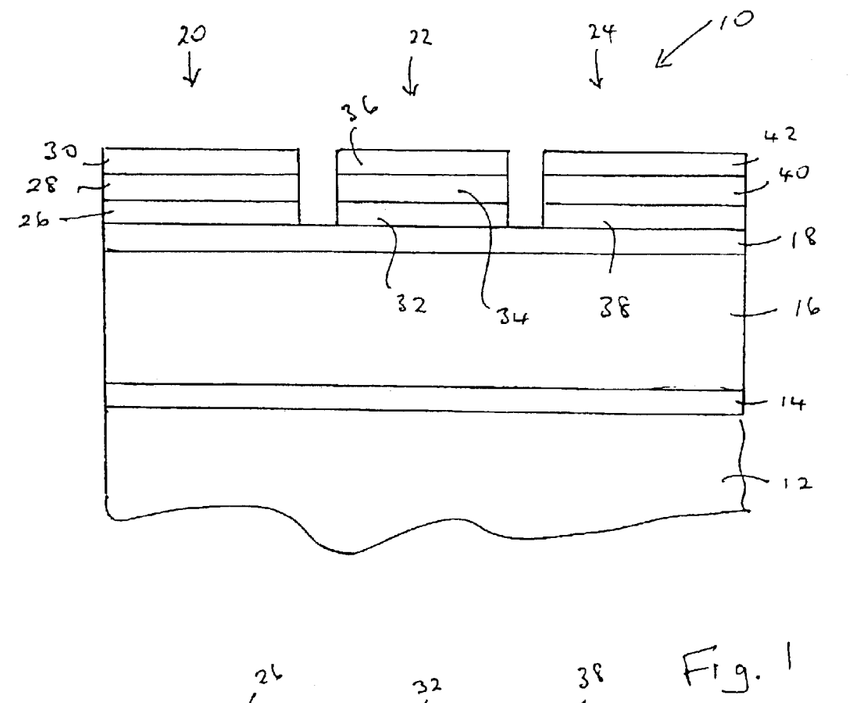
FIG. 1 is a schematic representation of a cross-section of an electroluminescent element.
Figure 2:
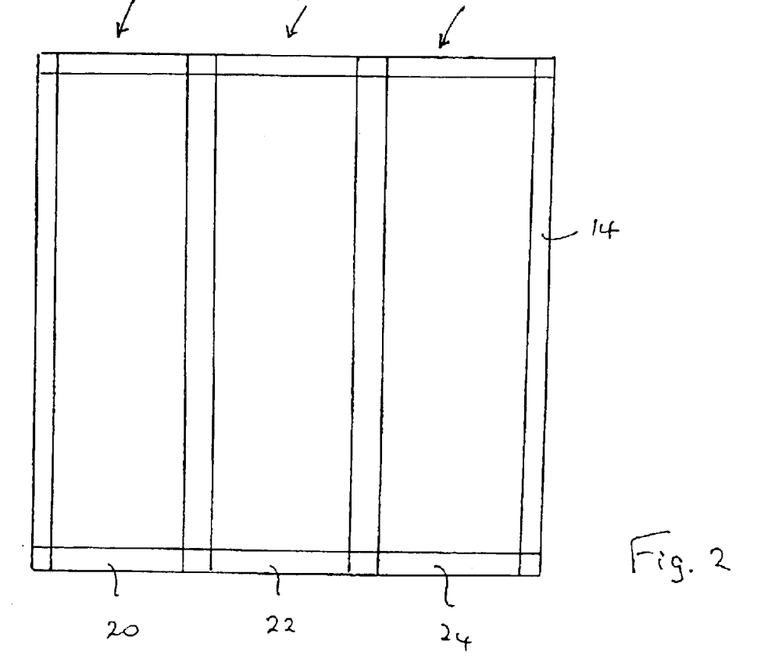
FIG. 2 is a schematic representation of a plan view of an electroluminescent element.

The present invention is further illustrated by the embodiment shown in FIGS. 1 and 2. FIG. 1 shows a cross-section of an electroluminescent device utilizing a phosphor of the present invention. FIG. 2 shows a plan view of the electroluminescent device. The electroluminescent device, generally indicated by 10, has a substrate 12 on which is located row electrode 14. Thick film dielectric 16 has thin film dielectric 18 thereon. Thin film dielectric 18 is shown with three pixel columns, referred to as 20, 22 and 24, located thereon. The pixel columns contain phosphors to provide the three basic colours viz. red, green and blue. Pixel column 20 has red phosphor 26 located in contact with thin film dielectric 18. Another thin film dielectric 28 is located on red phosphor 26, and column electrode 30 is located on thin film dielectric 28. Similarly, pixel column 22 has green phosphor 32 on thin film dielectric 18, with thin film dielectric 34 and column electrode 36 thereon. Pixel column 24 has blue phosphor 38 on thin film dielectric 18, with thin film dielectric 40 and column electrode 42 thereon.

It will be noted that electroluminescent device 10 does not have an optical filter associated with the blue phosphor 38. In FIG. 1, blue phosphor 38 is a phosphor of the invention and is as described herein.

The phosphor of the present invention provides a high luminosity blue emission that does not require an optical filter in order to achieve improved and acceptable colour coordinates for the blue sub-pixel element of a full colour electroluminescent display. The blue sub-pixel pixel performance is believed to meet the luminosity and colour temperature specifications for current generation cathode ray tube displays The present invention is illustrated by the following examples.

EXAMPLE I

A magnesium barium thioaluminate phosphor film was formed on a thick film substrate and annealed at a temperature of about 850° C.

The phosphor gave a relatively high energy conversion efficiency and a luminosity of 70 candelas per square meter with unfiltered CIE colour coordinates of x=0.13 and y=0.10 when operated at 250 Hz at a voltage that was 70 volts above a threshold voltage of 180 volts. This luminosity allows for an areal blue luminosity of 30 candelas per square meter when 50% of the active area of a pixel is occupied by the blue sub-pixel. Areal blue luminosity is defined as the blue luminosity averaged over the nominal image area of a display.

EXAMPLE II

A series of magnesium barium thioaluminate thin film phosphors materials were prepared by blending powders of aluminum sulphide, barium sulphide, magnesium sulphide and europium sulphide in the desired ratios and making pressed pellets of the blended powders. In the series of phosphor materials, the fraction "a" of barium replaced by magnesium in the formula $Mg_aBa_{1-a}Al_2S_4$:Eu was varied in increments of 0.1 over the range of a=0 to a=0.5. All of the phosphor materials had a nominal concentration of europium corresponding to 3 atomic percent of the sum of the magnesium and barium concentrations.

The pellets were placed in an alumina boat and fired in a nitrogen atmosphere using a belt furnace, using a temperature profile such that the films were subject to a nominal peak temperature of 900° C. for about 7 minutes. The actual sample temperature may have been lower than 900° C. because of the thermal capacity of the alumina boat.

The fired pellets with no magnesium i.e. a=0, did not show any visual changes following firing. Photoluminescence measurements on the fired pellets showed that this material was not homogenous when viewed under a magnifying glass, with different areas emitting different colours of light.

In contrast, pellets with a=0.3 showed some shrinkage, thereby indicating sintering following firing. For a=0.5, substantial deformation of the cylindrical pellet was observed after firing, with substantial broadening of the pellet at its base, indicating that significant melting had occurred. For a=0.4, some deformation occurred, but not to the same degree as for a=0.5.

The photoluminescence properties of the materials containing magnesium were examined, using a magnifying glass. It was found that all of the samples showed uniform blue emission. This indicates that the materials were homogeneous at the level of detail resolvable by a magnifying glass, with no evidence of a luminance-generating second phase precipitate.

X-ray diffraction analysis of a sample of material with a=0 i.e. with no magnesium, showed the presence of a variety of compounds, including barium thioaluminate, barium sulphide and one or more additional phases that might include $Ba_2Al_2S_5$, $Ba_4Al_2S_7$ or $Ba_5Al_2S_8$.

X-ray diffraction analysis of a sample of material containing magnesium, with a nominal value of a=0.2 showed a phase with a crystal structure very similar to barium thioaluminate but with slightly reduced lattice constants. This might be expected as a result of substitution of some barium by magnesium. The sample also contained barium sulphide, but in a lower concentration than for the sample without magnesium i.e. where a=0. There was an absence of the additional phases that were present in the sample without magnesium.

X-ray diffraction analysis of a sample of material containing magnesium, with a nominal value of a=0.5 showed a barium thioaluminate phase similar to that observed with the sample having a=0.2. However, the concentration of barium sulphide had been reduced to about half of that of the sample with a=0.2. There was no appreciable presence of the additional phases observed in the sample with a=0.

The CIE colour coordinate of the photo-stimulated light emission from the samples containing magnesium was y=0.10, compared to 0.13<y<0.14 for the sample not containing magnesium. This is a blue shift in the emission of the magnesium-containing materials, and indicates improved utility as blue phosphors. The reduced melting temperature for the magnesium-containing materials indicates that the materials should be amenable to annealing at lower temperatures than the materials not containing magnesium, which would make them more compatible with thick film dielectric substrates.

EXAMPLE III

Magnesium barium thioaluminate materials of the formula $Mg_aBa_{1-a}Al_2S_4$:Eu, with a nominal value of a=0.5 and a europium concentration equal to 3 atomic percent of the sum of the magnesium and barium concentrations, were deposited as thin films on thick film dielectric structures. The deposition method used was dual source electron beam evaporation, in which one source was a pressed pellet of aluminum sulphide ($Al_2S_3$) and the other source was a pressed pellet consisting of a mixture of barium sulphide, magnesium sulphide and europium sulphide. The phosphor films were annealed at a nominal temperature of 850° C. under nitrogen.

It should be noted that the stated composition for the materials in this example is for the source materials, and the composition of the deposited films may vary from these compositions.

The electroluminescent emission of the resultant phosphor showed the same blue shift with respect to material not containing magnesium as was observed with photoluminescence measurements. The luminance of the magnesium-containing phosphor was about 50 cd/m² at a voltage that was 50 volts above the threshold voltage of 160 volts for the fabricated electroluminescent pixel, and 90 cd/m² at 100 volts above the threshold voltage. The excitation frequency was 120 Hz.

In contrast, the luminance of a barium thioaluminate phosphor film without magnesium at the same excitation frequency, in a structure that was not identical, was about 25 to 30 cd/m² at 50 volts above the 190 volt threshold. The luminance was about 40 cd/m² at 70 volts above the threshold voltage.

EXAMPLE IV

The procedure of Example III was repeated, except that europium oxide ($Eu_2O_3$) was used instead of europium sulphide. The remaining compounds were aluminum sulphide, barium sulphide and magnesium sulphide, as in Example III. The nominal value of a in the formula of Example III was 0.5. The europium concentration was 3 atomic percent of the sum of the magnesium and barium concentrations.

It was found that the resultant phosphor had the same characteristics as the phosphor of Example III that had been formed using europium sulphide. It is therefore believed that europium sulphide may be replaced in whole or in part with europium oxide for europium concentrations of up to 3 atomic percent.

EXAMPLE V

This example illustrates the ability to control the elemental composition of a magnesium barium thioaluminate phosphor film deposited on a thick film dielectric structure using the method described in Example II. This example also shows the dependence on elemental composition of the colour coordinates of the light emission from the resulting electroluminescent element.

Two source pellets were used to deposit the phosphor film viz. aluminum sulphide and europium doped magnesium-barium sulphide. In this example, the deposition rate of aluminum sulphide relative to that for the europium-doped magnesium-barium sulphide was controlled by varying the electron beam power for the aluminum sulphide source pellet. The deposition rates of the two source materials were monitored using independent rate monitors. The composition of the deposited films was measured using secondary ion mass spectroscopy (SIMS).

Figure 3:
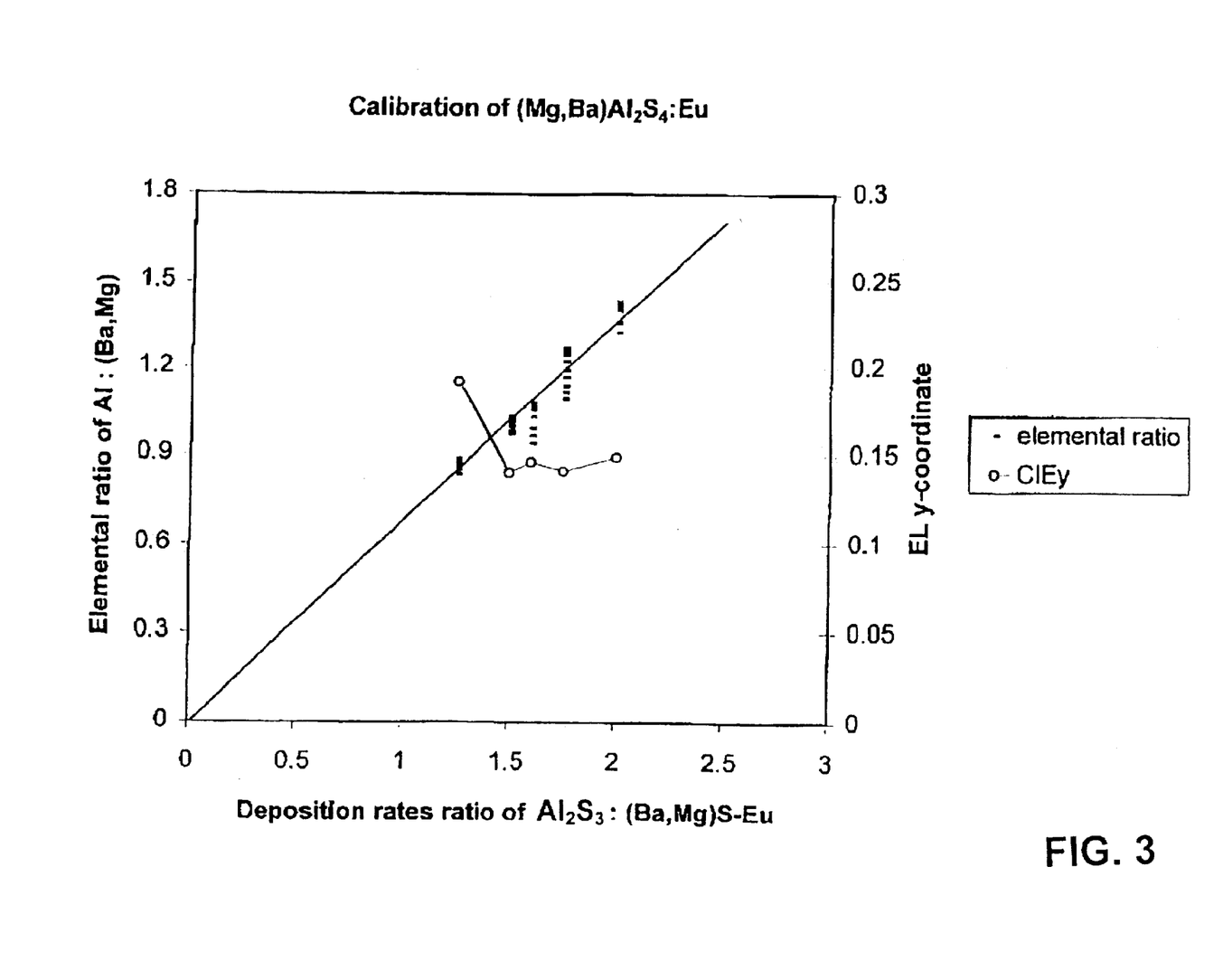
FIG. 3 is a graphical representation of data from Example V.

FIG. 3 shows the ratio of aluminum to the combined alkaline earth peaks i.e. the sum of the magnesium and barium peaks, observed in the SIMS spectrum plotted against the relative atomic deposition rate ratio for the two source materials. As can be seen, there is a linear relationship between the two variables, indicating that the ratio of aluminum to alkaline earth elements in the phosphor film is proportional to the relative deposition rates of the source materials.

FIG. 3 also shows the y colour coordinate of the electroluminescent emission for the phosphor materials as a function of the elemental composition. It is evident over the range evaluated that the y coordinate is not very sensitive to the elemental composition, although a tendency to a somewhat higher value is noted for the sample with the lowest aluminum concentration. The observed variation may be due, however, to other variables inherent in the materials and processes used in the fabrication of the pixel used. Although not shown, the x colour coordinate and the luminance also did not show any systematic dependence on the elemental composition over the range evaluated.

EXAMPLE VI

A series of europium-doped barium thioaluminate phosphor films, with thicknesses of approximately 420 nanometers, were electron-beam deposited using dual aluminum sulphide and europium doped barium sulphide sources onto clean 2 inch by 2 inch (5 cm by 5 cm) alumina substrates and then annealed at a temperature of 800° C. The europium concentration was varied so that the atomic ratio of europium to barium was in the range of 4 to 25 percent. The films were deposited in an atmosphere of up to 0.2 milliTorr of hydrogen sulphide.

Figure 4:
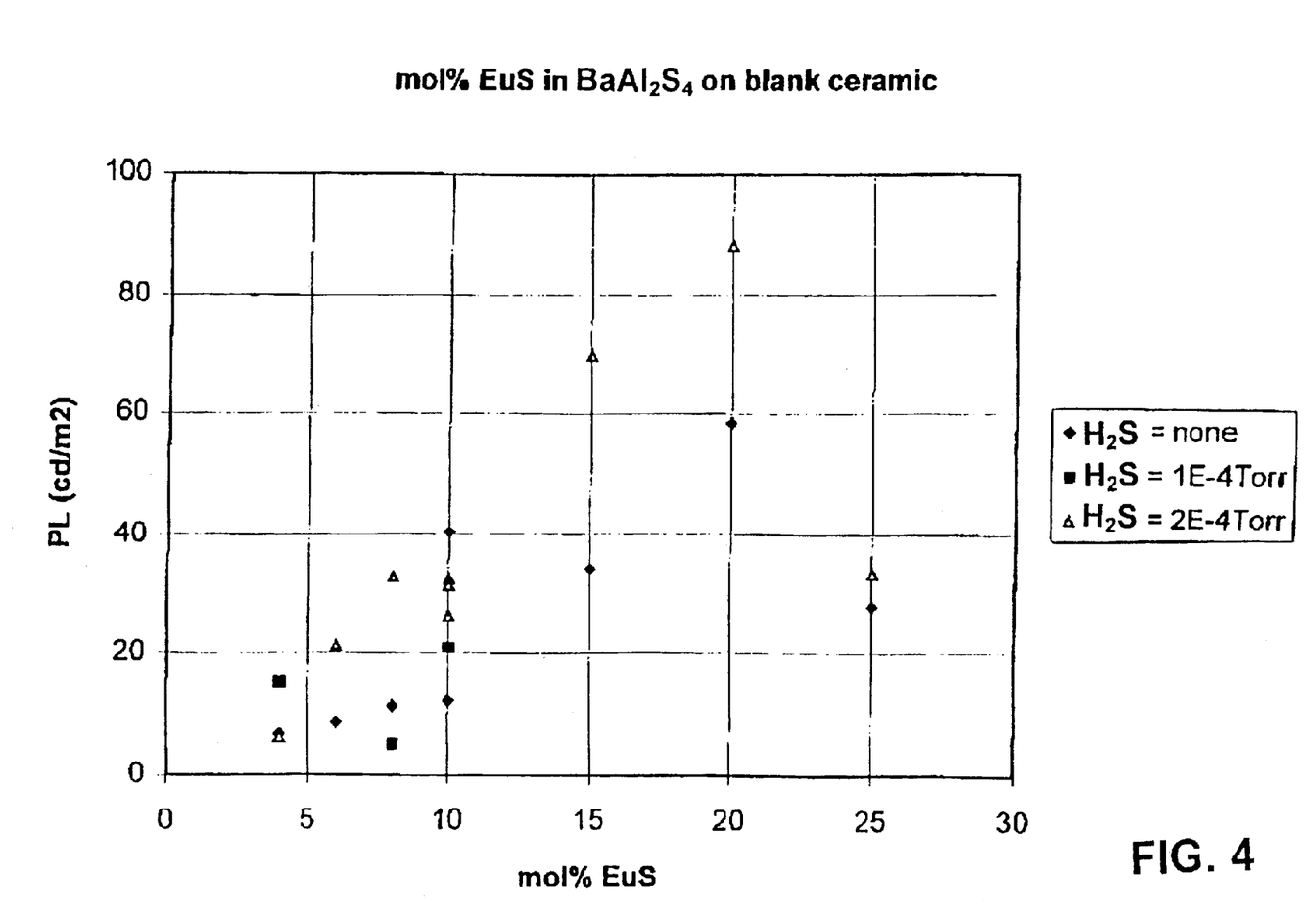
FIG. 4 is a graphical representation of data from Example VI.

The photoluminescence of the films when they were irradiated with 365 nm ultraviolet light was found to increase in an approximately linear manner for up to 20 atomic percent europium and then decrease at a higher concentration of 25 percent europium, as shown in FIG. 4. Correspondingly, the CIE x coordinate was constant at x=0.15. The CIE y coordinate was relatively unchanged at y=0.15 for up to 20 atomic percent europium and increased significantly to y=0.23 at 25 atomic percent europium.

No significant dependence of the photo-luminescence intensity or colour coordinates on the hydrogen sulphide pressure was observed, suggesting that the films were largely saturated with sulphur.

The data indicates a change in the photoluminescence properties as the europium concentration is increased above 20 atomic percent, although it cannot be concluded from this example that this change is directly related to the increase in the europium concentration.

EXAMPLE VII

Powders to form magnesium barium thioaluminate were prepared according to the method used in Example II, except that the powders were annealed at a temperature of 1000° C. under nitrogen for 10 minutes, rather than at 900° C. In addition, the fraction "a" of barium replaced by magnesium in the formula $Mg_aBa_{1-a}Al_2S_4$:Eu was varied over the range 0.10, 0.30–0.50, 0.70 and 0.90.

Visually, the samples with a=0.5 and a=0.7 were observed to be in a liquid state following annealing, whereas the sample with a=0.3 was observed to be molten only at its surface. The sample with a=0.9 was observed to consist of at least two crystal phases that respectively emitted green and blue light under 365 nm ultraviolet excitation. The sample with a=0.7 was not discernibly multi-phased.

The CIE x-coordinate for the photoluminescence was 0.14, independent of the value of "a". The CIE y coordinate was only slightly dependent on "a", increasing from about 0.11 for a=0.1 to 0.13 for a=0.9.

X-ray diffraction analysis of the samples showed that for the samples with a=0.1 and a=0.3, the dominant crystal phase has a crystal structure very close to that of barium thioaluminate and that a significant quantity of barium sulphide was present. The ratio of the quantity of these two phases was very close to that for the sample having a=0.2 annealed at 900° C. in Example II (rather than 1000° C. in the present example), indicating that the ratio of crystal phases in the pellets may be close to equilibrium for these elemental compositions. The phase having a crystal structure very close to that of barium thioaluminate ("the barium thioaluminate-like phase") may have a lattice constant slightly smaller than that for pure barium thioaluminate, possibly due to the substitution of some barium in the crystal lattice by magnesium.

The sample with a=0.5 showed the barium thioaluminate-like phase to be the dominant phase. There was no measurable quantity of barium sulphide. This is in contrast to the sample in Example II with a=0.5 that had been annealed at a lower temperature, which still showed an appreciable quantity of barium sulphide. Accordingly, for this nominal composition, the ratio of phases may not be an equilibrium ratio, at least for the lower annealing temperature. The samples with a=0.5 also had an additional phase with a crystal structure very close to that of manganese thioaluminate (although this compound could not be present because there was no manganese in the sample). The crystal differs from that of manganese thioaluminate in that an XRD peak is present corresponding to a crystal lattice spacing of 11.99 Angstroms that possibly corresponds to a superlattice distortion relative to a manganese thioaluminate structure.

The sample with a=0.7 showed the manganese thioaluminate-like phase with the 11.99 Angstrom peak as being the dominant phase, but with additional phases present including the barium thioaluminate-like phase and minor quantities of several phases not found in the samples with lower values of "a". Of the samples examined, this sample appears to be the only one that is comprised largely of a single crystal structure. An essentially single phase phosphor film in an electroluminescent display may be beneficial, as electrons injected into the phosphor film may have a reduced tendency to scatter from grain boundaries between different crystal phases and therefore have less tendency to lose energy in a manner that doesn't cause the emission of useful light. This would increase the electrical-to-light energy conversion efficiency of the display. It is possible that the single phase composition corresponds to a=0.75, and that the crystal structure of the compound has a crystal unit cell that has an integral multiple of the number of atoms in the unit cell for barium thioaluminate. Such a multiple may account for the large crystal lattice spacing of 11.99 Angstroms observed for some samples.

The sample with a=0.9 also had the crystal phase having the 11.99 Angstrom peak but substantially less of it. The sample also had the additional phases seen in the a=0.7 sample, in greater quantity, as well as further crystal phases not seen in the other samples. The additional phases are consistent with the presence of a short wavelength secondary emission peak in the PL spectra. There is also a slight shift of the main PL peak towards longer wavelength, which indicates a variability in the atomic environment of the europium activator in the main phase as the nominal composition is varied. This might indicate a range for the elemental composition of the main phase.

The samples with a=0.5 and a=0.7 both melted when they were annealed at 1000° C., whereas the other samples either did not melt at all at this temperature, or only slightly melted at the surface. It may be that a eutectic point for the compositions as a function of the magnesium to barium ratio exists for values of a between 0.4 and 0.8. From the perspective of constructing an electroluminescent display, the ability to anneal the phosphor at a reduced temperature is beneficial, because minimizing processing temperatures reduces or avoids thermally induced damage to the display structure being formed.

The photoluminescence spectra of the samples under 365 nm excitation was also recorded. In order to try to determine whether or not small emission peaks were masked by the main emission peak, the spectra were de-convoluted. The center of the emission peaks was selected. A mirror image of the half of the emission peak that decreased most steeply in amplitude from the center was reflected about the centre of the peak, and the thus constructed symmetrical peak was subtracted from the measured emission peak.

Figure 5:
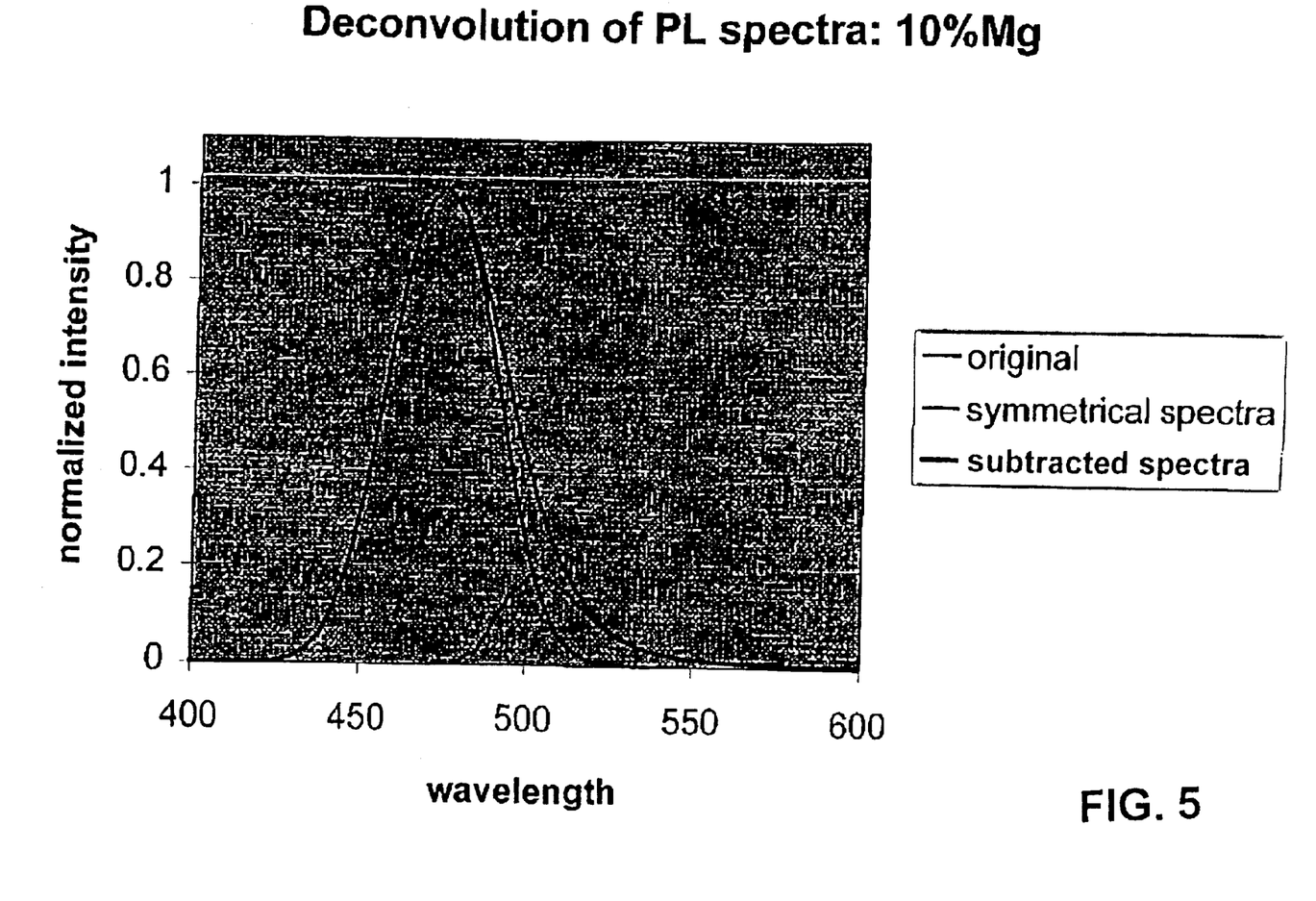
FIGS. 5–9 are graphical representations of data from Example VII.
Figure 6:
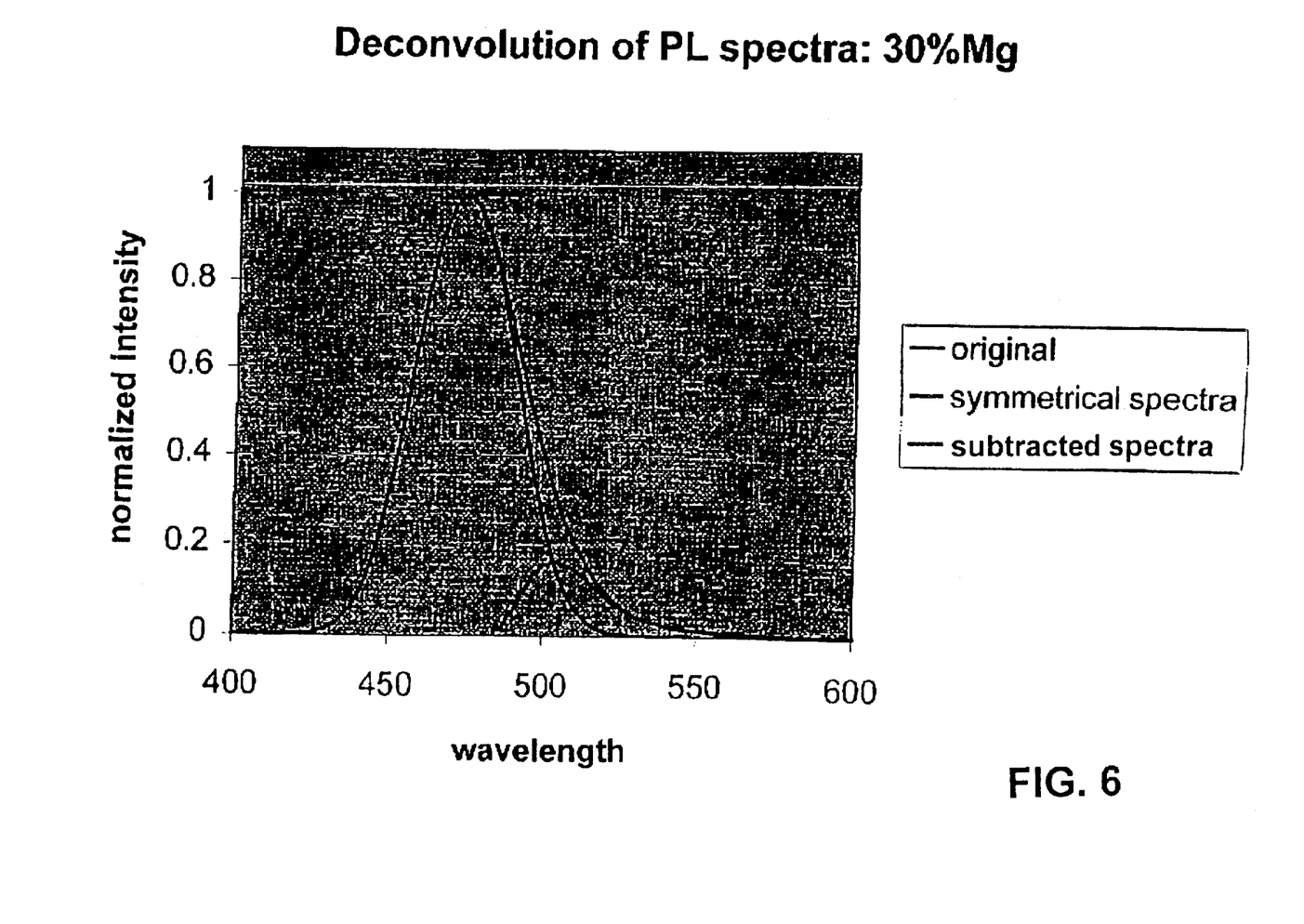
Figure 7:
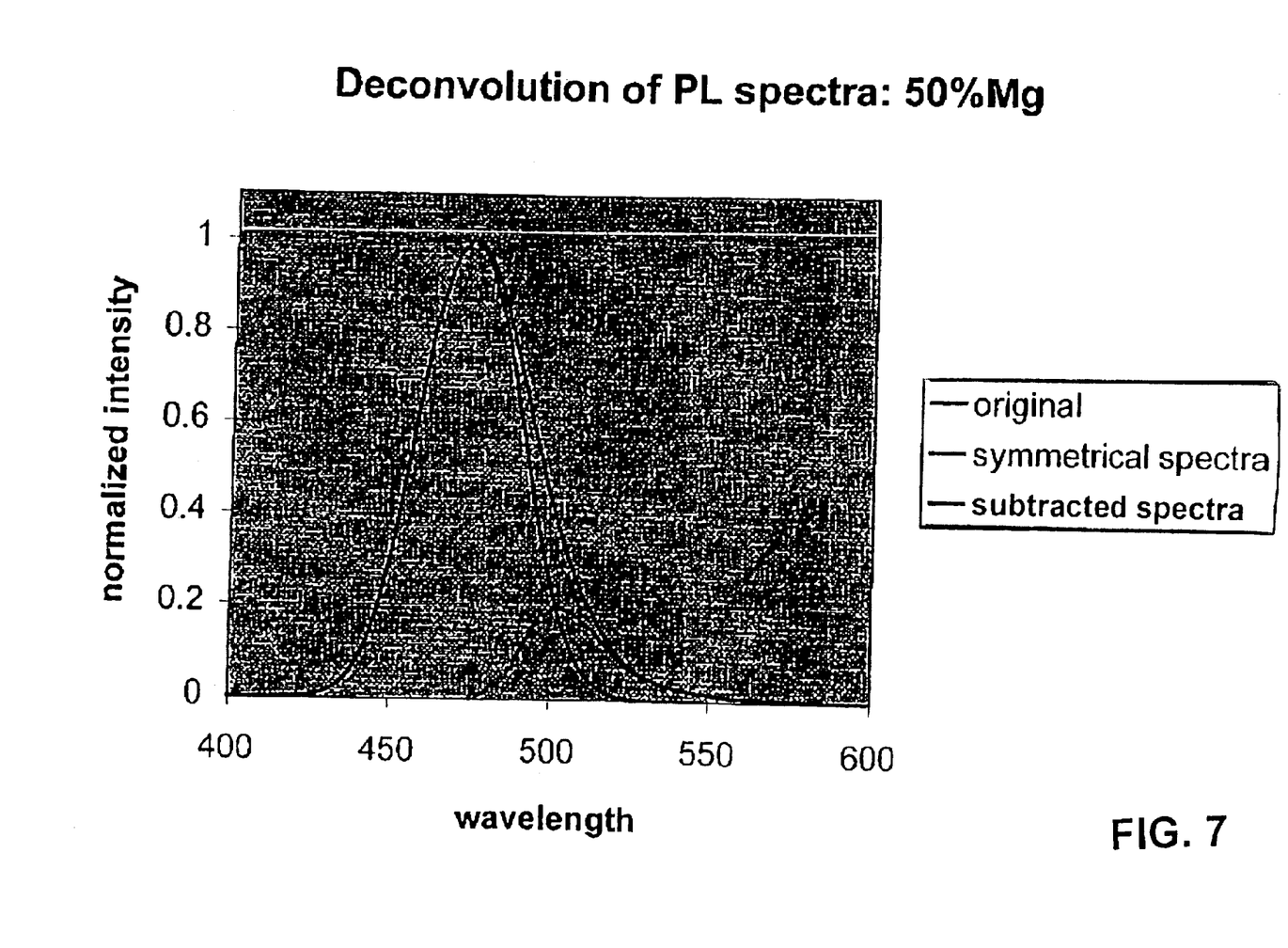
Figure 8:
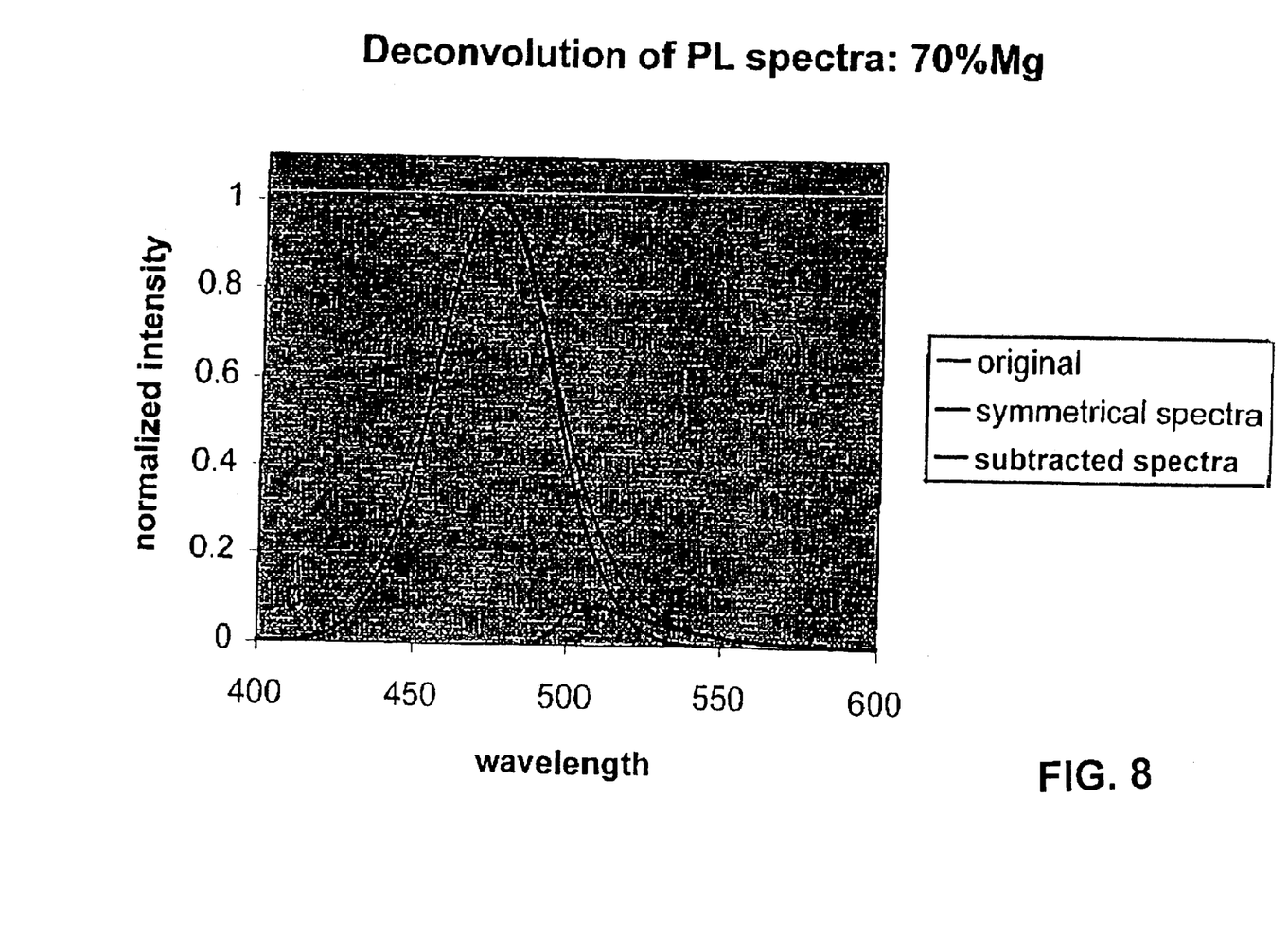
Figure 9:
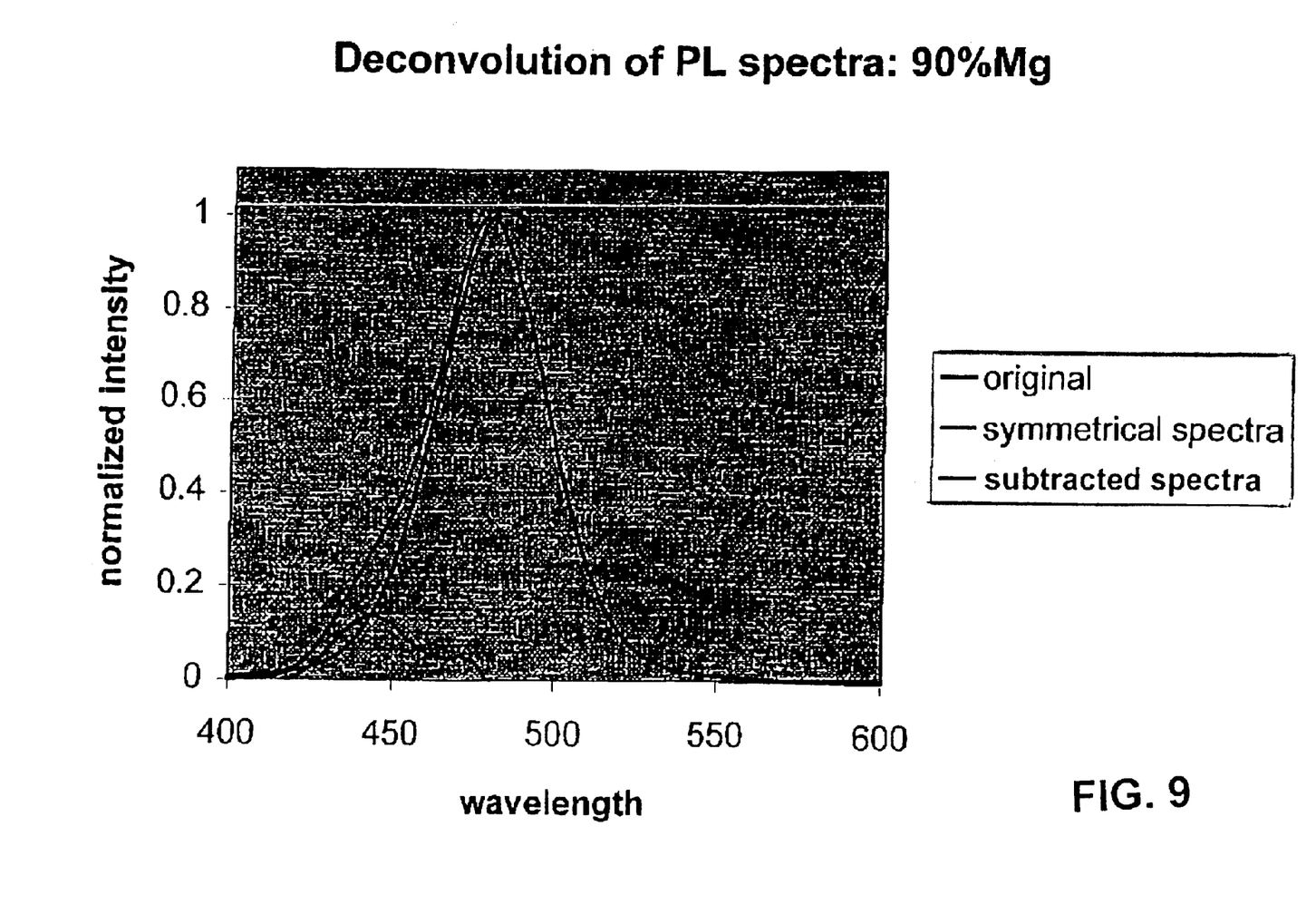

The resultant deconvoluted peak revealed the presence of small peaks shifted in wavelength from the main peak. The small peaks were shifted to longer wavelength from the main peak for a=0.1, a=0.3, and a=0.5 as shown in FIGS. 5, 6 and 7 respectively. For a=0.7, the amplitude of the small secondary peak is substantially smaller, although it is not shifted in wavelength, as shown in FIG. 8. For a=0.9, the secondary peak had disappeared, being replaced by another small secondary peak shifted to shorter wavelength from the main peak, as shown in FIG. 9. These results suggest that a minor emissive phase is present for "a" less than about 0.7 and that a different minor emissive phase is present for "a" approximately equal to 0.9. The larger peak was also observed to be shifted to longer wavelength for a=0.9, indicating a change in the crystal environment of the europium in the dominant phase contributing to the emission at this nominal magnesium content. This shift is consistent with the observed increase in the CIE y coordinate.

The results obtained correlate well with the XRD results, which indicate the presence of a barium thioaluminate-like phase for low values of "a" and a multiplicity of other distinct phases for "a" near 0.9. The results also correlate with the visible multi-colour light emission from the sample with "a" about equal to 0.9 when the sample is under ultraviolet emission.

What is claimed is:

1. A thick film dielectric electroluminescent display, comprising a phosphor composition of the formula:

$$M'_a Ba_{1-a} M''_2 M'''_4: RE$$

wherein:
M' is at least one element selected from the group consisting of magnesium and calcium,
M'' is at least one element selected from the group consisting of aluminum, gallium and indium,
M''' is at least one element selected from the group consisting of sulphur, selenium and tellurium,
RE is at least one rare earth element; and 0<a<1.

2. The thick film dielectric electroluminescent display of claim 1, wherein said phosphor is annealed.

3. The thick film dielectric electroluminescent display of claim 1, wherein M'' is aluminium.

4. The thick film dielectric electroluminescent display of claim 3, wherein RE is europium.

5. The thick film dielectric electroluminescent display of claim 4, wherein M''' is sulfur.

6. The thick film dielectric electroluminescent display of claim 5, wherein M' is magnesium.

7. The thick film dielectric electroluminescent display of claim 6, wherein "a" is in the range of 0.1 to 0.9.

8. The thick film dielectric electroluminescent display of claim 7, wherein "a" is in the range of 0.4 to 0.8.

9. The thick film dielectric electroluminescent display of claim 7, wherein "a" is in the range of 0.7 to 0.8.

10. The thick film dielectric electroluminescent display of claim 1, wherein said phosphor is provided as a thin film.

11. The thick film dielectric electroluminescent display of claim 3, wherein "a" is in the range of 0.5 to 0.75.

12. The thick film dielectric electroluminescent display of claim 2, wherein said phosphor is annealed at a temperature of at least about 600° C.

13. The thick film dielectric electroluminescent display of claim 12, wherein said phosphor is annealed onto a substrate of a ceramic material upon which is an electrically conductive thin film with a thick film dielectric layer thereon.

14. The thick film dielectric electroluminescent display of claim 13, wherein said ceramic material is alumina.

15. The thick film dielectric electroluminescent display of claim 2, wherein said phosphor is annealed at a temperature of at least about 850° C.

16. The thick film dielectric electroluminescent display of claim 1, wherein RE is europium present in an amount of not more than 3 atomic percent based on the amount of M' and barium.

17. The thick film dielectric electroluminescent display of claim 1, wherein said thick film dielectric electroluminescent display comprises;
a ceramic substrate;
an electrically conductive film on said substrate;
a thick film dielectric layer provided on said electrically conductive film;
wherein said phosphor is provided on said thick film dielectric layer.

18. The thick film dielectric electroluminescent display of claim 17, wherein said display additionally comprises an optically transparent electrically conductive film.

19. The thick film dielectric electroluminescent display of claim 18, wherein said display additionally comprises a thin film dielectric layer on said phosphor.

20. A phosphor, comprising a composition of the formula:

$$M'_a Ba_{1-a} M''_2 M'''_4: RE$$

wherein:
M' is at least one element selected from the group consisting of magnesium and calcium,
M'' is at least one element selected from the group consisting of aluminum, gallium and indium,
M''' is at least one element selected from the group consisting of sulphur, selenium and tellurium,
RE is at least one rare earth element; and 0<a<1.

* * * * *